(12) United States Patent
Futatsuyama

(10) Patent No.: US 12,321,598 B2
(45) Date of Patent: *Jun. 3, 2025

(54) NONVOLATILE SEMICONDUCTOR MEMORY DEVICE

(71) Applicant: Kioxia Corporation, Tokyo (JP)

(72) Inventor: Takuya Futatsuyama, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/101,338

(22) Filed: Jan. 25, 2023

(65) Prior Publication Data

US 2023/0168808 A1 Jun. 1, 2023

Related U.S. Application Data

(63) Continuation of application No. 17/238,822, filed on Apr. 23, 2021, now Pat. No. 11,592,987, which is a (Continued)

(30) Foreign Application Priority Data

Apr. 14, 2009 (JP) ................................ 2009-098416

(51) Int. Cl.
*G06F 3/00* (2006.01)
*G06F 3/06* (2006.01)
(Continued)

(52) U.S. Cl.
CPC ............ *G06F 3/061* (2013.01); *G06F 3/0619* (2013.01); *G06F 3/0652* (2013.01);
(Continued)

(58) Field of Classification Search
CPC . G11C 11/5628; G11C 16/0483; G11C 16/12; G11C 16/3459; G11C 11/5621;
(Continued)

(56) References Cited

U.S. PATENT DOCUMENTS 5,197,027 A 3/1993 Challa
7,443,724 B2 10/2008 Shibata et al.
(Continued)

FOREIGN PATENT DOCUMENTS

JP 2005-235260 9/2005
WO WO 2008/082888 A1 7/2008

OTHER PUBLICATIONS

Notification of Reason(s) for Refusal Issued on Nov. 13. 2012, in Japanese Patent Application No. 2009-098416 filed Apr. 14, 2009 (with English Translation).
(Continued)

*Primary Examiner* — Thong Q Le
(74) *Attorney, Agent, or Firm* — Oblon, McClelland, Maier & Neustadt, L.L.P.

(57) ABSTRACT

A nonvolatile semiconductor memory device comprises a cell unit including a first and a second selection gate transistor and a memory string provided between the first and second selection gate transistors and composed of a plurality of serially connected electrically erasable programmable memory cells operative to store effective data; and a data write circuit operative to write data into the memory cell, wherein the number of program stages for at least one of memory cells on both ends of the memory string is lower than the number of program stages for other memory cells, and the data write circuit executes the first stage program to the memory cell having the number of program stages lower than the number of program stages for the other memory cells after the first stage program to the other memory cells.

24 Claims, 23 Drawing Sheets

| WL# | D# | | |
|---|---|---|---|
| | case-1 | case-2 | case-3 |
| WL85 | D3 | D1 | D2 |
| WL84 | D3 | D3 | D3 |
| WL83 | D3 | D3 | D3 |
| ⋮ | ⋮ | ⋮ | ⋮ |
| WL2 | D3 | D3 | D3 |
| WL1 | D3 | D3 | D3 |
| WL0 | D1 | D3 | D2 |

Related U.S. Application Data continuation of application No. 16/775,739, filed on Jan. 29, 2020, now Pat. No. 11,016,670, which is a continuation of application No. 16/431,789, filed on Jun. 5, 2019, now Pat. No. 10,579,271, which is a continuation of application No. 15/903,629, filed on Feb. 23, 2018, now Pat. No. 10,346,053, which is a continuation of application No. 15/462,300, filed on Mar. 17, 2017, now Pat. No. 9,940,031, which is a continuation of application No. 15/166,895, filed on May 27, 2016, now Pat. No. 9,612,762, which is a continuation of application No. 14/707,908, filed on May 8, 2015, now Pat. No. 9,378,827, which is a continuation of application No. 14/075,400, filed on Nov. 8, 2013, now Pat. No. 9,058,877, which is a continuation of application No. 13/711,894, filed on Dec. 12, 2012, now Pat. No. 8,605,503, which is a continuation of application No. 12/724,636, filed on Mar. 16, 2010, now Pat. No. 8,369,142.

(51) Int. Cl.
  *G11C 11/56* (2006.01)
  *G11C 16/04* (2006.01)
  *G11C 16/10* (2006.01)
  *G11C 16/34* (2006.01)

(52) U.S. Cl.
  CPC .......... *G06F 3/0656* (2013.01); *G06F 3/0679* (2013.01); *G06F 3/0688* (2013.01); *G11C 11/5628* (2013.01); *G11C 16/0408* (2013.01); *G11C 16/045* (2013.01); *G11C 16/0483* (2013.01); *G11C 16/10* (2013.01); *G11C 16/3418* (2013.01); *G11C 2211/5648* (2013.01)

(58) Field of Classification Search
  CPC ............ G11C 16/3404; G11C 16/3418; G11C 16/3454; G11C 11/5642; G11C 16/00; G11C 16/10; G11C 16/3427; G11C 2211/5621; G11C 2211/5646; G11C 2211/5648; G11C 2216/14
  USPC ............ 365/185.03, 185.18, 185.17, 185.22, 365/185.24, 185.02, 185.05, 185.11, 365/185.12, 185.19, 185.2, 189.15, 365/230.03
  See application file for complete search history.

(56) References Cited

U.S. PATENT DOCUMENTS

| | | | |
|---|---|---|---|
| 7,499,320 B2 | 3/2009 | Li | |
| 7,558,118 B2 | 7/2009 | Futatsuyama | |
| 7,649,776 B2 | 1/2010 | Abiko et al. | |
| 7,782,670 B2 * | 8/2010 | Shibata | G11C 11/5628 365/185.12 |
| 7,940,575 B2 | 5/2011 | Ravasio | |
| 8,369,142 B2 | 2/2013 | Futatsuyama | |
| 8,605,503 B2 | 12/2013 | Futatsuyama | |
| 10,579,271 B2 * | 3/2020 | Futatsuyama | G11C 16/0408 |
| 2005/0056869 A1 | 3/2005 | Ichige | |
| 2006/0245261 A1 | 11/2006 | Morooka | |
| 2008/0219059 A1 | 9/2008 | Li | |
| 2008/0253181 A1 | 10/2008 | Edahiro et al. | |
| 2009/0067243 A1 | 3/2009 | Takase et al. | |
| 2009/0103358 A1 | 4/2009 | Sommer et al. | |
| 2009/0168515 A1 | 7/2009 | Shibata | |
| 2011/0286267 A1 * | 11/2011 | Rychlik | G11C 11/5628 365/185.03 |
| 2015/0243358 A1 | 8/2015 | Futatsuyama | |
| 2017/0182678 A1 | 7/2017 | Futatsuyama | |

OTHER PUBLICATIONS

Tae Kyung Kim et al., "16-Gigabit, 8-level NAND Flash Memory with 51nm 44-Cell String Technology", Solid-State Device Research Conference, 2008 (ESSA ERC 2008), 38$^{th}$ European, Sep. 15-19, 2008, pp. 111-114.

Tae-Kyung Kim et al., "Floating rate gate technology for high performance 8-level 3-bit NAND flash memory", Solid-State Electronics 53, 2009, pp. 792-797.

* cited by examiner

FIG. 3

| WL# | D# | | |
|---|---|---|---|
| | case-1 | case-2 | case-3 |
| WL85 | D3 | D1 | D2 |
| WL84 | D3 | D3 | D3 |
| WL83 | D3 | D3 | D3 |
| ⋮ | ⋮ | ⋮ | ⋮ |
| WL2 | D3 | D3 | D3 |
| WL1 | D3 | D3 | D3 |
| WL0 | D1 | D3 | D2 |

FIG. 5

| WL# | storage bits | 1 | 2 | 3 | 4 | 5 | 6 | 7 | 8 | 9 | 10 | 11 | 12 | 13 | ... | 242 | 243 | 244 | 245 | 246 | 247 | 248 | 249 | 250 | 251 | 252 | 253 | 254 | 255 | 256 |
|---|---|---|---|---|---|---|---|---|---|---|---|---|---|---|---|---|---|---|---|---|---|---|---|---|---|---|---|---|---|---|
| WL85 | D3 | | | | | | | | | | | | | | | | | | | | | | | | | | | | | 3rd |
| WL84 | D3 | | | | | | | | | | | | | | | | | | | | | | | | | | | | 3rd | |
| WL83 | D3 | | | | | | | | | | | | | | | | | | | | | | | | | | 3rd | | | |
| WL82 | D3 | | | | | | | | | | | | | | | | | | | | | | | | 3rd | | | | | |
| ... | ... | | | | | | | | | | | | | | | 1st | 2nd (WL81) | | | | 3rd (WL81) | 1st | 2nd | 3rd | 1st | 2nd | | | | | |
| ... | ... | | | | | | | | | | | | | | | | | | | 3rd (WL80) | | | | | | | | | | | |
| WL3 | D3 | | | | | 1st | 2nd | 3rd | 1st (WL4) | | | 1st (WL5) | 2nd (WL4) | 3rd | | | | | | | | | | | | | | | | |
| WL2 | D3 | | 1st | 2nd | | | | | | 2nd | 3rd | | | | | | | | | | | | | | | | | | | |
| WL1 | D3 | 1st | | 2nd | | 3rd | | | | | | | | | | | | | | | | | | | | | | | | |
| WL0 | D1 | | | | 1st | | | | | | | | | | | | | | | | | | | | | | | | | | prog. Order

FIG. 6A

| aggress \ victim | | WL0 |
|---|---|---|
| | | 1st |
| WL1 | 1st | |
| | 2nd | |
| | 3rd | × |

FIG. 6B

| aggress \ victim | | WL1 | | |
|---|---|---|---|---|
| | | 1st | 2nd | 3rd |
| WL0 | 1st | | × | |
| WL2 | 1st | × | | |
| | 2nd | | × | |
| | 3rd | | | × |

FIG. 7

| WL# | storage bits | 1 | 2 | 3 | 4 | 5 | 6 | 7 | 8 | 9 | 10 | 11 | 12 | 13 | ... | 242 | 243 | 244 | 245 | 246 | 247 | 248 | 249 | 250 | 251 | 252 | 253 | 254 | 255 | 256 |
|---|---|---|---|---|---|---|---|---|---|---|---|---|---|---|---|---|---|---|---|---|---|---|---|---|---|---|---|---|---|---|
| WL85 | D3 | | | | | | | | | | | | | | | | | | | | | | | | | | | | | 3rd |
| WL84 | D3 | | | | | | | | | | | | | | | | | | | | | | | | | | | | 3rd | |
| WL83 | D3 | | | | | | | | | | | | | | | | | | | | | | | | | | | 3rd | | |
| WL82 | D3 | | | | | | | | | | | | | | | | | | | | | | | 3rd | | | | | | |
| ... | ... | | | | | | | | | | | | | | | | | | | | | 1st | 2nd | | | 1st | 2nd | | | | |
| ... | ... | | | | | | | | | | | | | | | | 1st | 2nd (WL81) | | 1st | 2nd | 3rd (WL81) | | | | | | | | | |
| | | | | | | | | | 1st (WL4) | 2nd | 1st (WL5) | | 2nd (WL4) | 3rd | | | | 3rd (WL80) | | | | | | | | | | | | |
| WL3 | D3 | | | 1st | | 1st | 2nd | 3rd | | 2nd | | | | | | | | | | | | | | | | | | | | |
| WL2 | D3 | 1st | | 2nd | | 3rd | | | | | | | | | | | | | | | | | | | | | | | | |
| WL1 | D3 | 1st | 2nd | 3rd | | | | | | | | | | | | | | | | | | | | | | | | | | |
| WL0 | D1 | 1st | | | | | | | | | | | | | | | | | | | | | | | | | | | | | prog. Order

FIG. 8A

| aggress \ victim | | WL0 |
|---|---|---|
| | | 1st |
| WL1 | 1st | |
| | 2nd | × |
| | 3rd | × |

FIG. 8B

| aggress \ victim | | WL1 | | |
|---|---|---|---|---|
| | | 1st | 2nd | 3rd |
| WL0 | 1st | × | | |
| WL2 | 1st | × | | |
| | 2nd | | × | |
| | 3rd | | | × |

FIG. 9

| WL# | storage bits | 1 | 2 | 3 | 4 | 5 | 6 | 7 | 8 | 9 | 10 | 11 | 12 | prog. Order ... | 244 | 245 | 246 | 247 | 248 | 249 | 250 | 251 | 252 | 253 | 254 | 255 | 256 |
|---|---|---|---|---|---|---|---|---|---|---|---|---|---|---|---|---|---|---|---|---|---|---|---|---|---|---|---|
| WL85 | D1 | | | | | | | | | | | | | | | | | | | | | | | | | | 3rd |
| WL84 | D3 | | | | | | | | | | | | | | | | | | | | | | | | | 2nd | 3rd | |
| WL83 | D3 | | | | | | | | | | | | | | | | | | | | | | | | 1st | | | |
| WL82 | D3 | | | | | | | | | | | | | | | | | | | | | | 2nd | 3rd | | | | |
| ... | ... | | | | | | | | | | | | | ... | | | | | 1st | 2nd | 3rd (WL81) | | | | | | |
| ... | ... | | | | | | | | | | | | | ... | | | 2nd (WL81) | | 3rd (WL80) | | | | | | | | |
| WL3 | D3 | | | | | | | 1st | 2nd | 3rd | | | | | | | | | | | | | | | | | |
| WL2 | D3 | | | | | 1st | 2nd | 3rd | | | | | | | | | | | | | | | | | | | |
| WL1 | D3 | | | 1st | 2nd | 3rd | | | | | | | | | | | | | | | | | | | | | |
| WL0 | D3 | 1st | 2nd | | | | | | | | | | | | | | | | | | | | | | | | |

FIG. 10A

| aggress \ victim | | WL85 |
|---|---|---|
| | | 1st |
| WL84 | 1st | |
| | 2nd | × |
| | 3rd | × |

FIG. 10B

| aggress \ victim | | WL84 | | |
|---|---|---|---|---|
| | | 1st | 2nd | 3rd |
| WL85 | 1st | × | | |
| WL83 | 1st | | | |
| | 2nd | × | | |
| | 3rd | | × | |

FIG. 11

| WL# | storage bits | prog. Order | | | | | | | | | | | | | ... | ... | 243 | 244 | 245 | 246 | 247 | 248 | 249 | 250 | 251 | 252 | 253 | 254 | 255 | 256 |
|---|---|---|---|---|---|---|---|---|---|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | | | | | | | | | | | | | | | | |
| WL85 | D1 | | | | | | | | | | | | | | | | | | | | | | | | | | | | 1st | |
| WL84 | D3 | | | | | | | | | | | | | | | | | | | | | | | | | | | | | 3rd |
| WL83 | D3 | | | | | | | | | | | | | | | | | | | | | | | | | | | 2nd | | 3rd | |
| WL82 | D3 | | | | | | | | | | | | | | | | | | | | | | | | | | 3rd | | | | |
| ... | ... | | | | | | | | | | | | | | ... | | | | | | | | | 1st | 2nd | 3rd | | | | | |
| ... | ... | | | | | | | | | | | | | | ... | | | | | 1st | 2nd (WLB1) | 3rd (WLB1) | | | | | | | | | |
| | | | | | | | | | | | | 1st (WL5) | 2nd (WL4) | 3rd | | | | | 2nd (WLB1) | 3rd (WLB0) | | | | | | | | | | |
| WL3 | D3 | | | | | | | | 1st (WL4) | 2nd | 3rd | | | | | | | | | | | | | | | | | | | |
| WL2 | D3 | | | | 1st | 2nd | 3rd | | | | | | | | | | | | | | | | | | | | | | | |
| WL1 | D3 | | 1st | 2nd | 3rd | | | | | | | | | | | | | | | | | | | | | | | | | |
| WL0 | D3 | 1st | 2nd | 3rd | | | | | | | | | | | | | | | | | | | | | | | | | | |

FIG. 12A

| aggress \ victim | | WL85 |
|---|---|---|
| | | 1st |
| WL84 | 1st | |
| | 2nd | |
| | 3rd | × |

FIG. 12B

| aggress \ victim | | WL84 | | |
|---|---|---|---|---|
| | | 1st | 2nd | 3rd |
| WL85 | 1st | | × | |
| WL83 | 1st | | | |
| | 2nd | × | | |
| | 3rd | | × | |

FIG. 14

| WL# | storage bits | 1 | 2 | 3 | 4 | 5 | 6 | 7 | 8 | 9 | 10 | 11 | 12 | 13 | 14 | ... | 243 | 244 | 245 | 246 | 247 | 248 | 249 | 250 | 251 | 252 | 253 | 254 | 255 | 256 |
|---|---|---|---|---|---|---|---|---|---|---|---|---|---|---|---|---|---|---|---|---|---|---|---|---|---|---|---|---|---|---|
| WL85 | D2 | | | | | | | | | | | | | | | | | | | | | | | | | | | | | 2nd |
| WL84 | D3 | | | | | | | | | | | | | | | | | | | | | | | 1st | | | | | 3rd | |
| WL83 | D3 | | | | | | | | | | | | | | | | | | | | | | | | | | 1st | 2nd | | |
| WL82 | D3 | | | | | | | | | | | | | | | | | | | | | 1st | | | 2nd | 3rd | | | | |
| ... | ... | | | | | | | | | | | | | 1st (WL5) | 2nd (WL4) | ... | | | | 1st | | 2nd | | | 3rd (WL81) | | | | | |
| ... | ... | | | | | | | | | 1st (WL4) | | | 2nd (WL4) | | 3rd | ... | 1st | | 2nd (WL81) | | 3rd (WL80) | | | | | | | | | |
| WL3 | D3 | | | 1st | | | 1st | | 2nd | | 2nd | 3rd | | | | | | | | | | | | | | | | | | |
| WL2 | D3 | | 1st | | 2nd | | | 2nd | 3rd | | | | | | | | | | | | | | | | | | | | | |
| WL1 | D3 | 1st | | 2nd | | | 3rd | | | | | | | | | | | | | | | | | | | | | | | |
| WL0 | D2 | 1st | | | 2nd | | | | | | | | | | | | | | | | | | | | | | | | | |

| aggress \ victim | | WL0 | |
|---|---|---|---|
| | | 1st | 2nd |
| WL1 | 1st | | |
| | 2nd | × | |
| | 3rd | | × |

| aggress \ victim | | WL1 | | |
|---|---|---|---|---|
| | | 1st | 2nd | 3rd |
| WL0 | 1st | × | | |
| | 2nd | | × | |
| WL2 | 1st | × | | |
| | 2nd | | × | |
| | 3rd | | | × |

FIG. 17

| WL# | storage bits | 1 | 2 | 3 | 4 | 5 | 6 | 7 | 8 | ... | 163 | 164 | 165 | 166 | 167 | 168 | 169 | 170 | 171 |
|---|---|---|---|---|---|---|---|---|---|---|---|---|---|---|---|---|---|---|---|
| WL85 | D3 | | | | | | | | | | | | | | | | | | 2nd |
| WL84 | D3 | | | | | | | | | | | | | | | | | 2nd | |
| WL83 | D3 | | | | | | | | | | | | | | | | 2nd | | |
| WL82 | D3 | | | | | | | | | | | | | | 1st | | | | |
| ... | ... | | | | | | | | | ... | | | 1st | 2nd | | | | | |
| ... | ... | | | | | | | 1st (WL4) | 2nd | ... | 1st | 2nd (WL81) | | | | | | | |
| WL3 | D3 | | | | | 1st | 2nd | | | | | | | | | | | | |
| WL2 | D3 | | | 1st | 2nd | | | | | | | | | | | | | | |
| WL1 | D3 | 1st | 2nd | | | | | | | | | | | | | | | | |
| WL0 | D1 | 1st | | | | | | | | | | | | | | | | | | prog. Order

FIG. 18A

| aggress \ victim | | WL0 |
|---|---|---|
| | | 1st |
| WL1 | 1st | |
| | 2nd | × |

FIG. 18B

| aggress \ victim | | WL1 | |
|---|---|---|---|
| | | 1st | 2nd |
| WL0 | 1st | × | |
| WL2 | 1st | × | |
| | 2nd | | × |

FIG. 19

| WL# | storage bits | 1 | 2 | 3 | 4 | 5 | 6 | 7 | 8 | 9 | 10 | 11 | 12 | 13 | ... | 242 | 243 | 244 | 245 | 246 | 247 | 248 | 249 | 250 | 251 | 252 | 253 | 254 | 255 | 256 |
|---|---|---|---|---|---|---|---|---|---|---|---|---|---|---|---|---|---|---|---|---|---|---|---|---|---|---|---|---|---|---|
| WL85 | D3 | | | | | | | | | | | | | | | | | | | | | | | | 1st | 2nd | 3rd | | | |
| WL84 | D3 | | | | | | | | | | | | | | | | | | | | | 1st | 2nd | 3rd | | | | | | 3rd |
| WL83 | D3 | | | | | | | | | | | | | | | | | | | 1st | 2nd | 3rd | | | | | | 3rd | | |
| WL82 | D3 | | | | | | | | | | | | | | | 1st | 2nd (WL81) | 3rd (WL81) | | | | | | | | | | | | |
| ... | ... | | | | | | | | | | | | | | | | | 3rd (WL80) | | | | | | | | | | | | |
| ... | ... | | | | | | | | 1st (WL4) | 2nd | 3rd | 1st (WL5) | 2nd (WL4) | 3rd | | | | | | | | | | | | | | | | |
| WL3 | D3 | | | | | 1st | 2nd | 3rd | | | | | | | | | | | | | | | | | | | | | | |
| WL2 | D3 | | | 1st | 2nd | | 3rd | | | | | | | | | | | | | | | | | | | | | | | |
| WL1 | D3 | 1st | | | | | | | | | | | | | | | | | | | | | | | | | | | | |
| WL0 | D1 | 1st | | | | | | | | | | | | | | | | | | | | | | | | | | | | |

FIG. 20A

| aggress \ victim | | WL0 |
|---|---|---|
| | | 1st |
| WL1 | 1st | × |
| | 2nd | × |
| | 3rd | × |

FIG. 20B

| aggress \ victim | | WL1 | | |
|---|---|---|---|---|
| | | 1st | 2nd | 3rd |
| WL0 | 1st | | | |
| WL2 | 1st | × | | |
| | 2nd | | × | |
| | 3rd | | | × |

FIG. 20C

| aggress \ victim | | WL(k) | | |
|---|---|---|---|---|
| | | 1st | 2nd | 3rd |
| WL(k−1) | 1st | | | |
| | 2nd | × | | |
| | 3rd | | × | |
| WL(k+1) | 1st | × | | |
| | 2nd | | × | |
| | 3rd | | | × |

FIG. 21

| WL# | storage bits | 1 | 2 | 3 | 4 | 5 | 6 | 7 | 8 | 9 | 10 | 11 | 12 | 13 | 14 | ... | 243 | 244 | 245 | 246 | 247 | 248 | 249 | 250 | 251 | 252 | 253 | 254 | 255 | 256 |
|---|---|---|---|---|---|---|---|---|---|---|---|---|---|---|---|---|---|---|---|---|---|---|---|---|---|---|---|---|---|---|
| WL85 | D2 | | | | | | | | | | | | | | | | | | | | | | | | | 1st | | | 2nd | |
| WL84 | D3 | | | | | | | | | | | | | | | | | | | | | | 1st | | | | 2nd | | | 3rd |
| WL83 | D3 | | | | | | | | | | | | | | | | | | | 1st | | | | 2nd | | | | 3rd | | |
| WL82 | D3 | | | | | | | | | | | | | | | | 1st | | | | 2nd | | | | 3rd | | | | | |
| ... | ... | | | | | | | | | | | | | | | | | 2nd (WL81) | | | | 3rd (WL81) | | | | | | | | |
| ... | ... | | | | | | | | | | | | | | | | | | 3rd (WL80) | | | | | | | | | | | |
| WL3 | D3 | | | | | | 1st | | | | 2nd | 3rd | | | | | | | | | | | | | | | | | | |
| WL2 | D3 | | | | 1st | | | 2nd | 3rd | | | | | | | | | | | | | | | | | | | | | |
| WL1 | D3 | | | 1st | | 2nd | | | | | | | | | | | | | | | | | | | | | | | | |
| WL0 | D2 | 1st | 2nd | | | | | | | | | | | | | | | | | | | | | | | | | | | | prog. Order

FIG. 22A

| aggress \ victim | | WL0 | |
|---|---|---|---|
| | | 1st | 2nd |
| WL1 | 1st | × | |
| | 2nd | | × |
| | 3rd | | × |

FIG. 22B

| aggress \ victim | | WL1 | | |
|---|---|---|---|---|
| | | 1st | 2nd | 3rd |
| WL0 | 1st | | | |
| | 2nd | × | | |
| WL2 | 1st | × | | |
| | 2nd | | × | |
| | 3rd | | | × |

FIG. 23

| WL# | storage bits | prog. Order | | | | | | | | | | | | | | | | | | |
|---|---|---|---|---|---|---|---|---|---|---|---|---|---|---|---|---|---|---|---|---|
| | | 1 | 2 | 3 | 4 | 5 | 6 | 7 | 8 | ... | 163 | 164 | 165 | 166 | 167 | 168 | 169 | 170 | 171 |
| WL85 | D3 | | | | | | | | | | | | | | | | | | 2nd |
| WL84 | D3 | | | | | | | | | | | | | | | | | 2nd | |
| WL83 | D3 | | | | | | | | | | | | | | | 2nd | | 1st | |
| WL82 | D3 | | | | | | | | | | | | | | 1st | | | | |
| ... | ... | | | | | | | | | ... | | | | 2nd | | | | | |
| ... | ... | | | | | | | | | ... | 1st | | | | | | | | |
| WL3 | D3 | | | | | | | 1st (WL4) | 2nd | | | 2nd (WL81) | | | | | | | |
| WL2 | D3 | | | 1st | | 1st | 2nd | | | | | | | | | | | | |
| WL1 | D3 | | 1st | | 2nd | | | | | | | | | | | | | | |
| WL0 | D1 | 1st | | | | | | | | | | | | | | | | | |

FIG. 24A

| aggress \ victim | | WL0 |
|---|---|---|
| | | 1st |
| WL1 | 1st | × |
| | 2nd | × |

FIG. 24B

| aggress \ victim | | WL1 | |
|---|---|---|---|
| | | 1st | 2nd |
| WL0 | 1st | | |
| WL2 | 1st | × | |
| | 2nd | | × |

FIG. 24C

| aggress \ victim | | WL(k) | |
|---|---|---|---|
| | | 1st | 2nd |
| WL(k−1) | 1st | | |
| | 2nd | × | |
| WL(k+1) | 1st | × | |
| | 2nd | | × |

NONVOLATILE SEMICONDUCTOR MEMORY DEVICE

CROSS-REFERENCE TO RELATED APPLICATION

This application is a continuation of U.S. application Ser. No. 17/238,822, filed Apr. 23, 2021, which is a continuation of U.S. application Ser. No. 16/775,739 (now U.S. Pat. No. 11,016,670) filed Jan. 29, 2020, which is a continuation of U.S. application Ser. No. 16/431,789 (now U.S. Pat. No. 10,579,271) filed Jun. 5, 2019, which is a continuation of U.S. application Ser. No. 15/903,629 (now U.S. Pat. No. 10,346,053) filed Feb. 23, 2018, which is a continuation of U.S. application Ser. No. 15/462,300 (U.S. Pat. No. 9,940,031) filed Mar. 17, 2017, which is a continuation of U.S. application Ser. No. 15/166,895 (now U.S. Pat. No. 9,612,762) filed May 27, 2016, which is a continuation of U.S. application Ser. No. 14/707,908 (now U.S. Pat. No. 9,378,827) filed May 8, 2015, which is a continuation of U.S. application Ser. No. 14/075,400 (now U.S. Pat. No. 9,058,877) filed Nov. 8, 2013, which is a continuation of U.S. application Ser. No. 13/711,894 (now U.S. Pat. No. 8,605,503) filed Dec. 12, 2012, which is a continuation of U.S. application Ser. No. 12/724,636 (now U.S. Pat. No. 8,369,142) filed Mar. 16, 2010, and is based upon and claims the benefit of priority from the prior Japanese Patent Application No. 2009-98416, filed on Apr. 14, 2009, the entire contents of each of which are incorporated herein by reference.

BACKGROUND OF THE INVENTION

Field of the Invention

The present invention relates to a nonvolatile semiconductor memory device, in particular to a NAND-type flash memory.

Description of the Related Art

As an electrically erasable programmable and highly scalable nonvolatile semiconductor memory device (EEPROM), a NAND-type flash memory has been known. The NAND-type flash memory includes a plurality of memory cells serially connected in such a form that adjacent ones share a source/drain diffused layer to configure a NAND cell unit. Both ends of the NAND cell unit are connected to a bit line and a source line via respective selection gate transistors. Such the configuration of the NAND cell unit makes it possible to achieve a smaller unit cell area and larger capacity storage than that of the NOR-type.

The memory cell in the NAND-type flash memory includes
a charge storage layer (floating gate) formed on a semiconductor substrate with a tunnel insulator film interposed therebetween, and a control gate stacked thereon with an inter-gate insulator film interposed therebetween, thereby storing data nonvolatilely in accordance with a charge storage state of the floating gate. Specifically, for example, a high threshold voltage state resulted from injection of electrons into the floating gate is defined as data "0", a low threshold voltage state resulted from release of electrons from the floating gate is defined as data "1", and the memory cell stores binary data. Recently, a program threshold distribution is fragmented to achieve multi-valued storage such as four-valued storage.

The fine fabrication of the flash memory and the fragmentation of the program threshold distribution cause the following problems.

Firstly, as for a memory cell adjacent to the selection gate transistor, electrons are injected into the floating gate under the influence of the gate-induced drain leakage current GIDL (Gate-Induced Drain Leakage), and therefore failed write is caused easily.

Secondly, the shorter the distance between memory cells are, the stronger the interference between adjacent cells becomes, for example. This is because scaling in the longitudinal direction is more difficult than the reduction by scaling in the lateral direction in the cell array.

More specifically, the floating gate of the memory cell is capacitively coupled to the control gate (word line) located above and to the substrate (channel) located immediately beneath. When cells are fine-fabricated, the capacity between the floating gate of one memory cell and the floating gate of a memory cell adjacent thereto increases relative to the capacity between the floating gate and the control gate and substrate. The inter-cell interference based on the capacitive coupling between the floating gates of the adjacent cells exerts an influence on the threshold of the already data-programmed memory cell so that the threshold is shifted in accordance with the threshold fluctuation of a memory cell to be data-programmed later.

As for the first problem, a dummy cell not for use in data storage may be arranged adjacent to the selection gate transistor. Such a system is effective to a certain extent (see, for example, Patent Document 1: JP 2004-127346A).

Memory cells for multi-valued storage may be used to achieve a larger capacity while memory cells for binary storage may be used only as memory cells on both ends of a memory string adjacent to the selection gate transistors to provide the threshold distribution with a margin, thereby improving the reliability as in a technology proposed (Non-Patent Document 1: "16-Gigabit, 8-level NAND Flash Memory with 51 nm 44-Cell String Technology", Tae-Kyung Kim, et al. Solid-State Device Research Conference, 2008. ESSDERC 2008. 38th European).

These measures, however, can not solve the second problem. In particular, in the case of the structure as in Non-Patent Document 1, the number of program stages for the memory cells on both ends of the memory string is lower than the number of program stages for other memory cells. Therefore, it is difficult to recover the fluctuation of the threshold distribution caused by the inter-cell interference from the adjacent memory cell as a problem.

SUMMARY OF THE INVENTION

In an aspect the present invention provides a nonvolatile semiconductor memory device, comprising: a cell unit including a first and a second selection gate transistor and a memory string provided between the first and second selection gate transistors and composed of a plurality of serially connected electrically erasable programmable memory cells operative to store effective data; and a data write circuit operative to write data into the memory cell, wherein the number of program stages for at least one of memory cells on both ends of the memory string is lower than the number of program stages for other memory cells, and the data write circuit executes the first stage program to the memory cell having the number of program stages lower than the number of program stages for the other memory cells after the first stage program to the other memory cells.

In another aspect the present invention provides a nonvolatile semiconductor memory device, comprising: a cell unit including a first and a second selection gate transistor and a memory string provided between the first and second selection gate transistors and composed of a plurality of serially connected electrically erasable programmable memory cells operative to store effective data; and a data write circuit operative to write data into the memory cell, wherein the total number of storage bits in the memory string is a power of 2, and the number of storage bits in at least one of memory cells on both ends of the memory string is lower than the number of storage bits in other memory cells, and the data write circuit, on writing data into the memory string, executes the first stage program to a certain memory cell adjacent to the memory cell having the lower number of storage bits, and then executes a program to the memory cell having the lower number of storage bits, adjacent to the certain memory cell.

In yet another aspect the present invention provides a nonvolatile semiconductor memory device, comprising: a cell unit including a first and a second selection gate transistor and a memory string provided between the first and second selection gate transistors and composed of a plurality of serially connected electrically erasable programmable memory cells operative to store effective data; and a data write circuit operative to write data into the memory cell, wherein the number of program stages for at least one of memory cells on both ends of the memory string is lower than the number of program stages for other memory cells, and the data write circuit, on writing data into the memory string, after execution of the first program and before execution of the last program to a certain memory cell adjacent to the memory cell having the lower number of program stages, executes the first program through the last program to the memory cell having the lower number of program stages, adjacent to the certain memory cell.

BRIEF DESCRIPTION OF THE DRAWINGS

FIG. 3 is a diagram showing a data assignment in the same flash memory.

FIG. 5 is a diagram showing a data program order in the same flash memory.

FIGS. 6A and 6B provide diagrams showing the inter-cell interference effect in the data program order of FIG. 5.

FIG. 7 is a diagram showing a data program order in a flash memory according to a second embodiment of the present invention.

FIGS. 8A and 8B provide diagrams showing the inter-cell interference effect in the data program order of FIG. 7.

FIG. 9 is a diagram showing a data program order in a flash memory according to a third embodiment of the present invention.

FIGS. 10A and 10B provide diagrams showing the inter-cell interference effect in the data program order of FIG. 9.

FIG. 11 is a diagram showing a data program order in a flash memory according to a fourth embodiment of the present invention.

FIGS. 12A and 12B provide diagrams showing the inter-cell interference effect in the data program order of FIG. 11.

FIG. 14 is a diagram showing a data program order in the same flash memory.

FIG. 17 is a diagram showing a data program order in the same flash memory.

FIGS. 18A and 18B provide diagrams showing the inter-cell interference effect in the data program order of FIG. 17.

FIG. 19 is a diagram showing a data program order in a flash memory according to an example for comparison with the first embodiment of the present invention.

FIGS. 20A-20C provide diagrams showing the inter-cell interference effect in the data program order of FIG. 19.

FIG. 21 is a diagram showing a data program order in a flash memory according to an example for comparison with the fifth embodiment of the present invention.

FIGS. 22A and 22B provide diagrams showing the inter-cell interference effect in the data program order of FIG. 21.

FIG. 23 is a diagram showing a data program order in a flash memory according to an example for comparison with the sixth embodiment of the present invention.

FIGS. 24A-24C provide diagrams showing the inter-cell interference effect in the data program order of FIG. 23.

DETAILED DESCRIPTION OF THE EMBODIMENTS

The nonvolatile semiconductor memory device according to the present invention will now be described about the embodiments in detail with reference to the drawings.

First Embodiment

Figure 1:
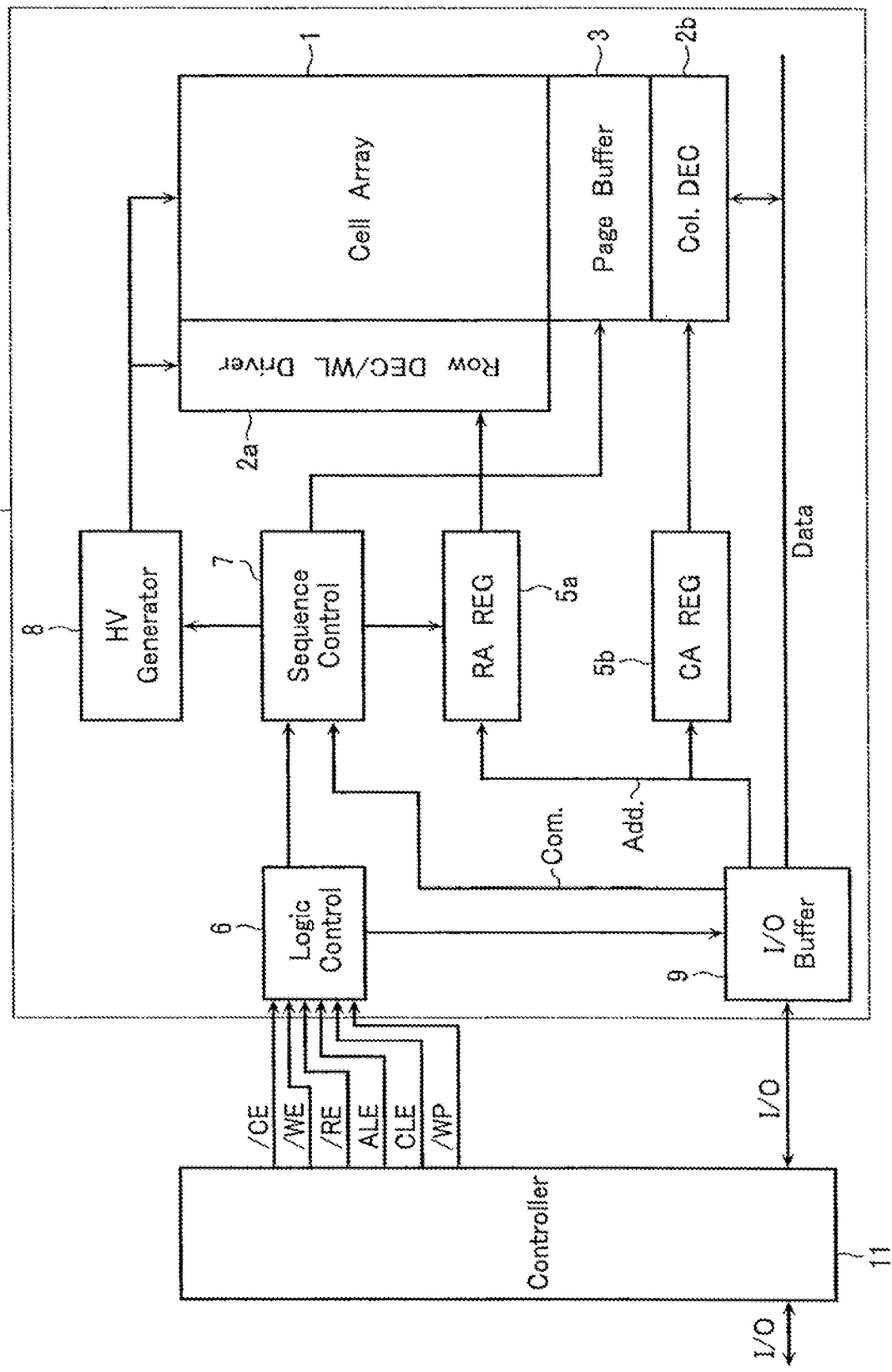
FIG. 1 is a diagram showing a configuration of a flash memory according to a first embodiment of the present invention.

FIG. 1 is a block diagram showing a configuration of a NAND-type flash memory according to a first embodiment of the present invention. This NAND-type flash memory comprises a NAND chip 10, and a controller 11 operative to control the NAND chip 10.

A memory cell array 1 contained in the NAND chip 10 includes a plurality of memory cells MC of the floating gate type arrayed in matrix as described later. A row decoder/word line driver 2a, a column decoder 2b, a page buffer 3 and a high voltage generator 8 configure a data write/read circuit operative to execute data write and read to the memory cell array 1 on a page basis. The row decoder/word line driver 2a drives word lines and selection gate lines in the memory cell array 1. The page buffer 3 includes sense amplifier circuits and data holding circuits for 1 page to execute data read and write to the memory cell array 1 on a page basis.

The read data for 1 page in the page buffer 3 is column-selected in order by the column decoder 2b and provided to an external I/O terminal via an I/O buffer 9. Write data fed from the I/O terminal is selected by the column decoder 2b and loaded in the page buffer 3. Write data for 1 page is loaded in the page buffer 3. Row and column address signals are received via the I/O buffer 9 and transferred to the row decoder 2a and to the column decoder 2b, respectively. A row address register 5a holds an erase block address on erasing, and a page address on programming and reading. A column address register 5b receives a start column address for write data loading before the beginning of writing, and a start column address for reading. The column address register Sb holds the input column address until a write enable /WE or a read enable /RE is toggled under a certain condition.

A logic control circuit 6 controls the input of commands and addresses and the input/output of data based on a chip enable signal /CE, a command enable signal CLE, an address latch enable signal ALE, a write enable signal /WE, a read enable signal /RE and so forth. Reading and writing can be executed in accordance with the commands. On receipt of a command, a sequence control circuit 7 executes a sequence control on reading, writing or erasing. The high voltage generator 8 is controlled by the control circuit 7 to generate voltages required for various operations.

The controller 11 executes control on data write and read under a condition appropriate to the current programmed state in the NAND chip 10. A part of later-described read control may be executed in the NAND chip 10, needless to say.

Figure 2:
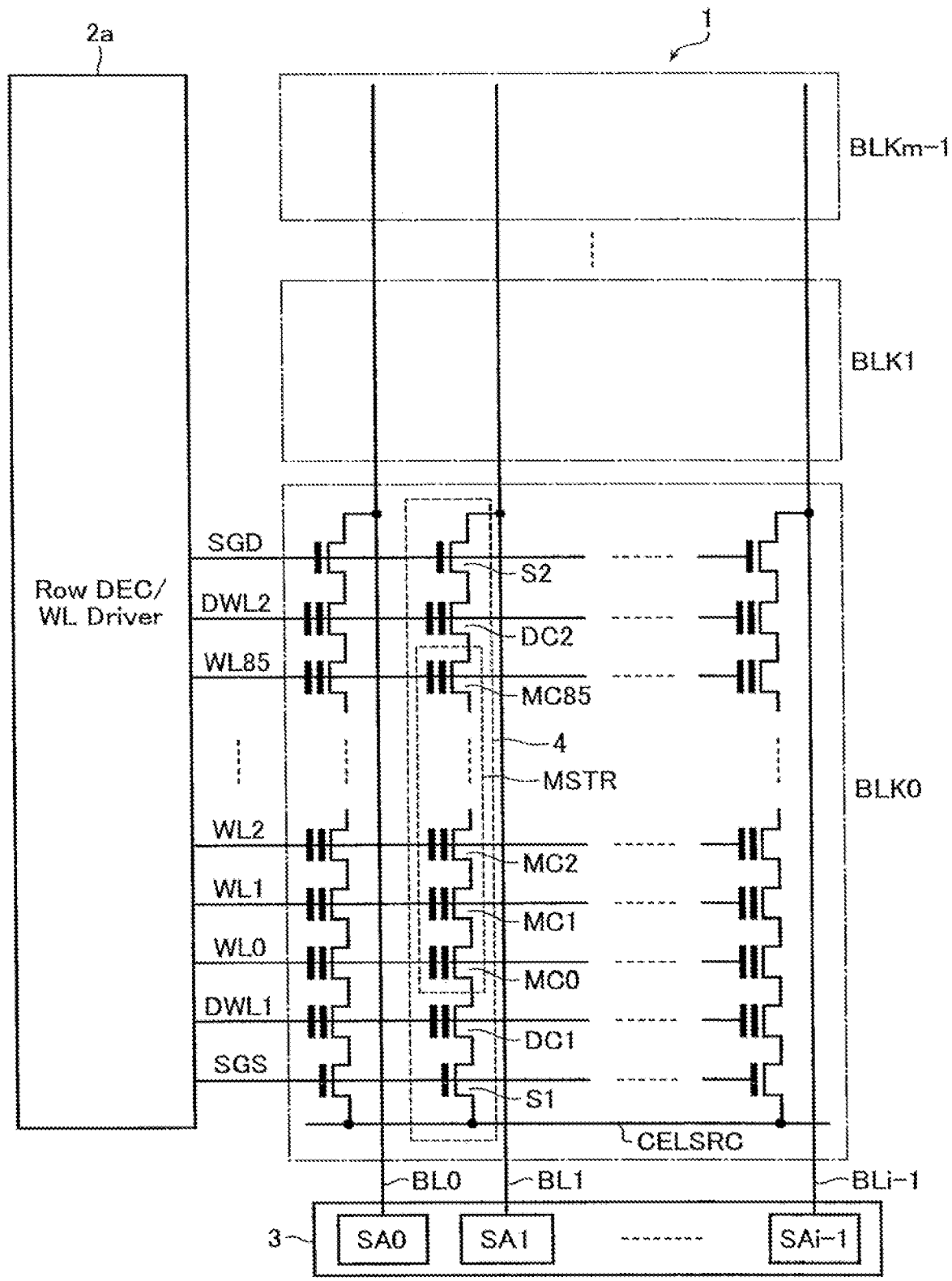
FIG. 2 is a diagram showing a memory cell array configuration of the same flash memory.

FIG. 2 shows a specific configuration of the cell array 1. In this example, a memory string MSTR composed of 86 serially connected memory cells MC0-MC85, and selection gate transistors S1, S2 connected to both ends thereof configure a NAND cell unit 4. The selection gate transistor S1 has a source connected to a common source line CELSRC, and the selection gate transistor S2 has a drain connected to a bit line BL (BL0-BL$_{i-1}$). The memory cells MC0-MC85 have control gates connected to word lines (WL0-WL85), respectively. The selection gate transistors S1, S2 have gates connected to selection gate lines SGS, SGD.

As shown in FIG. 2, dummy word lines DWL1, DWL2 having a structure equal to the word line WL and dummy cells DC1, DC2 having a structure equal to the memory cell MC may be provided between the memory string MSTR and the selection gate transistors S1, S2, respectively, if required. In this case, the influence of the gate-induced drain leakage current GIDL exerted from the selection gate transistors S1, S2 can be relieved. Therefore, it is possible to enhance the disturb resistance of the memory cells MC0, MC85 arranged on both ends of the memory string MSTR.

A range of plural memory cells MC along one word line WL is referred to as a page that is a unit of simultaneous data read and data write. Hereinafter, a page including plural memory cells MCi along one word line WLi (i=0-85) may be expressed as a page <i>. A range of plural NAND cell units 4 aligned in the word line WL direction configures a cell block BLK that is a unit of data simultaneous erase. In FIG. 2, plural cell blocks BLK0-BLK$_{m-1}$ sharing the bit line BL are aligned in the bit line BL direction to configure the cell array 1.

The word lines WL and the selection gate lines SGS, SGD are driven by the row decoder 2a. The bit lines BL are connected to the sense amplifier circuits SA (SA0-SA$_{i-1}$) in the page buffer 3.

FIG. 3 is a diagram showing a data assignment in the memory cell array shown in FIG. 2.

The memory string MSTR in the NAND-type flash memory comprises 86 memory cells MC, most of which can store 3 bits. From the viewpoint of an affinity for computers, the number of storage bits in at least one of the memory cell MC0 adjacent to the selection gate transistor S1 and the memory cell MC85 adjacent to the selection gate transistor S2 is made lower than 3 bits so that the total number of storage bits in the memory string MSTR equals a power of 2.

In the case 1 of FIG. 3, 1-bit data is assigned to the memory cell MC0 closest to the selection gate transistor S1 (D1), and 3-bit data is assigned to other memory cells MC1-MC85 (D3).

In the case 2, 1-bit data is assigned to the memory cell MC85 closest to the selection gate transistor S2 (D1), and 3-bit data is assigned to other memory cells MC0-MC84 (D3).

In the case 3, 2-bit data is assigned to the memory cells MC0 and MC85 (D2), and 3-bit data is assigned to other memory cells MC1-MC84 (D3).

In any one of the above cases, the total number of storage bits in the memory string MSTR equals a power of 2, that is, 256 bits.

In the present embodiment the following description handles the flash memory with the data assignment of the case 1.

Next, operation of the present embodiment thus configured is described.

In the following description, the "page" has 2 different meanings and accordingly caution must be taken.

The first is a "page" as a unit of simultaneous data access along one word line.

The second is a "page" indicative of a hierarchy of storage data when multi-valued data is stored in one memory cell, that is, a program stage. In this case, it is referred to as L (Lower) page, M (Middle) page, U (Upper) page and so forth.

Figure 4A:
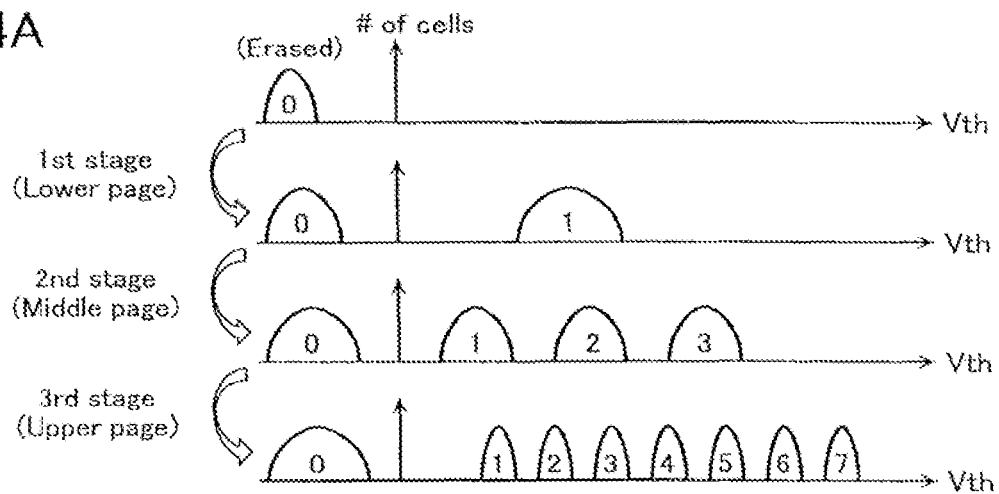
FIGS. 4A-4C provide diagrams showing data distribution examples in the same flash memory.
Figure 4B:
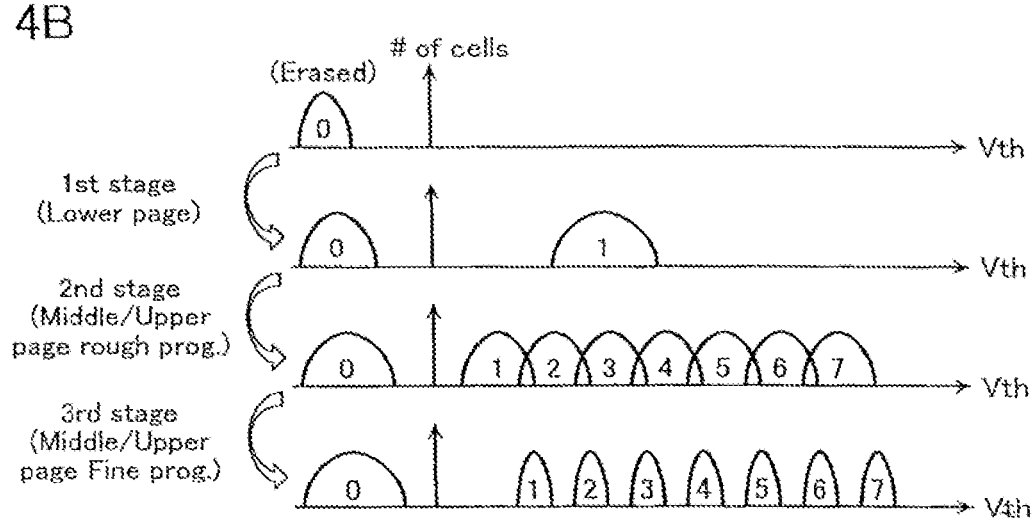
Figure 4C:
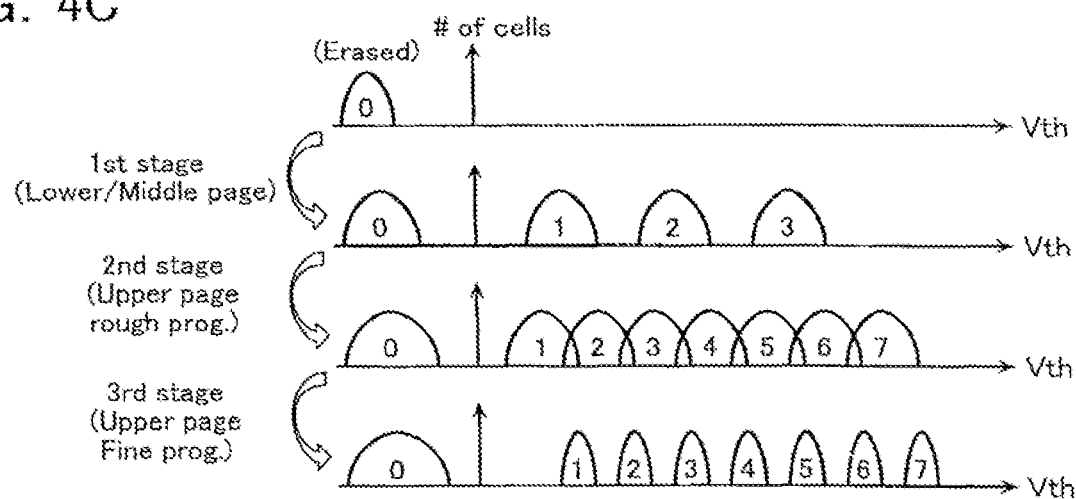

FIGS. 4A-4C provide diagrams showing data distribution examples in the memory cells MC when 3-bit data program is executed in three program stages.

The memory cells MC have been data-erased previously by block erase to bring the thresholds of all memory cells MC in the block to the lowermost "0" level.

In the case of FIG. 4A, in the first stage program (1st stage), L page program is executed in accordance with the data to pull up the threshold of L page data "0" to "1". In FIG. 4, L page data "0" and "1" corresponds to binary data 1 and 0, respectively.

Subsequently, in the second stage program (2nd stage), M page program is executed in accordance with L page data "0" or "1" to generate threshold distributions of M page data "0" or "1", "2", "3". In FIGS. 4A-4C, M page data "0", "1", "2" and "3" corresponds to binary data 11, 01, 00 and 10, respectively.

Finally, in the third stage program (3rd stage), U page program is executed in accordance with M page data "0" or "1"-"3" to generate threshold distributions of U page data "0" or "1"-"7". In FIG. 4, U page data "0", "1", "2", "3", "4", "5", "6" and "7" corresponds to binary data 111, 011, 001, 101, 100, 000, 010, 110, respectively, as an example.

In the case of FIG. 4B, in the first stage program (1st stage), L page program is executed to pull up the threshold of L page data "0" to "1" as in the case of FIG. 4A.

Subsequently, in the second stage program (2nd stage), M page and U page rough program is executed, thereby generating U page data "0" or "1"-"7" in accordance with L page data "0" or "1". At this time, the threshold distributions of U page data "1"-"7" overlap adjacent threshold distributions, respectively.

Finally, in the third stage program (3rd stage), M page and U page fine program is executed, thereby narrowing the threshold distributions of U page data "1"-"7" overlapped after the second stage program to separate them definitely.

In the case of FIG. 4C, in the first stage program (1st stage), L page and M page program is executed, thereby generating threshold distributions of M page data "0"-"3" in accordance with L page data "0".

Subsequently, in the second stage program (2nd stage), U page rough program is executed, thereby generating threshold distributions of U page data "0"-"7" in accordance with M page data "0"-"3". At this time, the threshold distributions of U page data "1"-"7" overlap adjacent threshold distributions, respectively.

Finally, in the third stage program (3rd stage), U page fine program is executed, thereby narrowing the threshold distributions of U page data "1"-"7" overlapped after the second stage program to separate them definitely.

In any one of FIGS. 4A-4C, the threshold distributions in the memory cell MCi after each program stage are widened under the inter-cell interference effect caused by programs to be executed later to adjacent memory cells MCi−1 and i+1. This effect can be corrected to some extent by the subsequent program to the memory cell MCi. On the other hand, the influence exerted from one inter-cell interference differs in accordance with the numbers of program stages for the adjacent memory cells MCi−1 and MCi+1. For example, in any one of FIGS. 4A-4C, with respect to the third stage program, the applied electrical energy is relatively low. Therefore, the influence of the inter-cell interference caused by the program becomes relatively lower than those at the time of programming in the first stage and the second stage.

The following description is given to a data program order for the NAND-type flash memory configured as above.

First, prior to description of the data program order in the present embodiment, a data program order for a flash memory in a comparison example is described with reference to FIGS. 19 and 20A-20C.

FIG. 19 is a diagram showing the data program order in the comparison example, and FIGS. 20A-20C provide diagrams showing the inter-cell interference effect in the data program order of FIG. 19. This example shows that 1-bit data is programmed in one program stage for a page including the memory cell MC0 connected to the word line WL0 while 3-bit data is programmed in three program stages for a page including the memory cells MC1-MC85. (In the following description, a page including the memory cell MCk (k=an integer of 0-85) connected to the word line WLk is represented by the "page<k>".) A mark x in FIGS. 20A-20C indicates that the inter-cell interference effect arises. For example, in the case of FIG. 20A, it indicates that the first stage program to a page <1> exerts the inter-cell interference effect on the threshold distributions after the first stage program to an adjacent page <0>.

The program to 1 block is finished through 256 times programming.

Firstly, in the first programming, the first stage program is executed to the page <0> closest to the selection gate transistor S1.

The first programming herein refers to first programming after erase for a block and corresponds, for example, to programming executed first after the block, to which the program-target page belongs, varies during the process of 2-block data program.

Subsequently, in the second programming, the first stage program is executed to the page <1>. As a result, the threshold distributions after the first stage program to the page <1> adjacent to the page <0> fluctuate in accordance with the inter-cell interference as shown in FIG. 20A.

Subsequently, in the third programming, the first stage program is executed to the page <2>. As a result, the threshold distributions after the first stage program to the page <1> adjacent to the page <2> fluctuate in accordance with the inter-cell interference as shown in FIG. 20B.

Subsequently, in the fourth programming, the second stage program is executed to the page <1>. As a result, the threshold distributions after the first stage program to the page <0> adjacent to the page <1> and the threshold distributions after the first stage program to the page <2> fluctuate in accordance with the inter-cell interference as shown in FIGS. 20A and 20C.

Subsequently, in the 5-253th programming, the first stage program to the page <k>, the second stage program to the page <k-1> and the third stage program to the page <k−2> are executed in order within a range of k=5-85. As a result, the threshold distributions after the i-th (i=an integer of 1-3) stage program to the certain page <k> fluctuate in accordance with the inter-cell interference caused by the (i+1)-th (except i=3) stage program to the page <k−1> and the i-th stage program to the page <k+1> as shown in FIG. 20C.

Finally, in the 254-256th programming, the second stage program to the page <85>, the third stage program to the page <84> and the third stage program to the page <85> are executed in order.

Next, a data program order in the present embodiment is described with reference to FIGS. 5 and 6A, 6B.

FIG. 5 is a diagram showing the data program order in the present embodiment, and FIGS. 6A and 6B provide diagrams showing the inter-cell interference effect in the data program order of FIG. 5. In FIGS. 6A and 6B the inter-cell interference effect on the page <k> (k=an integer of 2-85) is similar to FIG. 20C and omitted therefrom.

Firstly, in the first programming, the first stage program is executed to the page <1> other than the page <0> closest to the selection gate transistor S1.

Subsequently, in the second programming, the first stage program is executed to the page <2>. As a result, the threshold distributions after the first stage program to the page <1> adjacent to the page <2> fluctuate in accordance with the inter-cell interference as shown in FIG. 6B.

Subsequently, in the third programming, the second stage program is executed to the page <1>. As a result, the threshold distributions after the first stage program to the page <2> adjacent to the page <1> fluctuate in accordance with the inter-cell interference as shown in FIG. 20C.

Subsequently, in the fourth programming, the first stage program is executed to the page <0> closest to the selection gate transistor S1. As a result, the threshold distributions after the second stage program to the page <1> adjacent to the page <0> fluctuate in accordance with the inter-cell interference as shown in FIG. 6B.

As for the 5-256th programming, they are similar to those in the comparison example shown in FIG. 19 and accordingly omitted from the following description.

In the present embodiment, the memory cell MC0 in the page <0> closest to the selection gate transistor S1 is designed to have the number of storage bits equal to 1 bit, thereby improving the disturb characteristic at the time of programming.

In the case of the comparison example shown in FIG. 19, the threshold distributions after the first stage program to the page <0> are susceptible to the inter-cell interference caused by all the programs to the page <1>. In addition, the threshold distributions after the second stage program to the page <1> are susceptible to the inter-cell interference caused by the second stage program to the page <2>.

On the other hand, in the case of the present embodiment, the threshold distributions after the first stage program to the page <0> are only susceptible to the inter-cell interference caused by the third stage program to the page <1>. In addition, the threshold distributions after the second stage program to the page <1> are susceptible to the inter-cell interference caused by the first stage program to the page <0> and the second stage program to the page <2>. Further, the threshold distributions after the second stage program to the page <k> (k=an integer of 2-84) are susceptible to the inter-cell interference caused by the third stage program to the page <k−1> and the second stage program to the page <k+1>.

Therefore, if the influence of the inter-cell interference caused by the third stage program is not greatly different from the influence of the inter-cell interference caused by the first stage program, the present embodiment makes it possible to reduce the influence of the inter-cell interference exerted on the page <0> from the program to the page <1>.

The present embodiment is also applicable to various programming methods as shown in FIGS. 4A-4C.

Second Embodiment

Next, a data program order in a second embodiment of the present invention is described. The present embodiment, similar to the first embodiment, relates to the flash memory with the data assignment in the case 1 of FIGS. 4A-4C, and executes data program to the page <0> in one program stage and to other pages <k> (k=an integer of 2-85) in three program stages.

FIG. 7 shows the data program order in the present embodiment, and FIGS. 8A and 8B provide diagrams showing the inter-cell interference effect in the data program order of FIG. 7. In FIGS. 8A and 8B the inter-cell interference effects on the pages <k> (k=an integer of 2-85) are similar to FIG. 20C and omitted therefrom.

Firstly, in the first programming, the first stage program is executed to the page <1> other than the page <0> closest to the selection gate transistor S1.

Subsequently, in the second programming, the first stage program is executed to the page <0> closest to the selection gate transistor S1. As a result, the threshold distributions after the first stage program to the page <1> adjacent to the page <0> fluctuate in accordance with the inter-cell interference as shown in FIG. 8B.

Subsequently, in the third programming, the first stage program is executed to the page <2>. As a result, the threshold distributions after the first stage program to the page <1> adjacent to the page <2> fluctuate in accordance with the inter-cell interference as shown in FIG. 8B.

Subsequently, in the fourth programming, the second stage program is executed to the page <1>. As a result, the threshold distributions after the first stage program to the page <0> adjacent to the page <1> and the threshold distributions after the first stage program to the page <2> fluctuate in accordance with the inter-cell interference as shown in FIGS. 8A and 21C.

As for the 5-256th programming, they are similar to those in the comparison example shown in FIG. 19 and accordingly omitted from the following description.

Thus, in the present embodiment, the threshold distributions after the first stage program to the page <0> are only susceptible to the inter-cell interference caused by the second stage and third stage program to the page <1>. In addition, the threshold distributions after the second stage program to the page <1> are susceptible to the inter-cell interference caused by the second stage program to the page <2>.

Therefore, the present embodiment makes it possible to reduce the influence of the inter-cell interference exerted on the page <0> by the inter-cell interference caused by the first stage program to the page <1>, when compared with the comparison example shown in FIG. 19.

Third Embodiment

Next, a data program order in a third embodiment of the present invention is described. The present embodiment relates to the flash memory with the data assignment in the case 2 of FIGS. 4A-4C, and executes data program to the page <85> in one program stage and executes data program to other pages <k> (k=an integer of 0-84) in three program stages.

FIG. 9 shows the data program order in the present embodiment, and FIGS. 10A and 10B provide diagrams showing the inter-cell interference effect in the data program order of FIG. 9. In FIG. 9 the inter-cell interference effects on the pages <0>-<83> are similar to FIG. 20C and omitted therefrom.

Firstly, in the first programming, the first stage program is executed to the page <0>.

Subsequently, in the second programming, the second stage program is executed to the page <1>. As a result, the threshold distributions after the first stage program to the page <0> adjacent to the page <1> fluctuate in accordance with the inter-cell interference as shown in FIG. 20C.

Subsequently, in the third programming, the second stage program is executed to the page <0>. As a result, the threshold distributions after the first stage program to the page <1> adjacent to the page <0> fluctuate in accordance with the inter-cell interference as shown in FIG. 20C.

Subsequently, in the 4-255th programming, the first stage program to the page <k>, the second stage program to the page <k−1>, and the third stage program to the page <k−2> are executed in order within a range of k=5-85. As a result, the threshold distributions after the i-th (i=1-3) stage program to the certain page <k> fluctuate in accordance with the inter-cell interference caused by the (i+1)-th (except i=3) stage program to the page <k−1> and the i-th stage program to the page <k+1> as shown in FIG. 20C.

Finally, in the 256th programming, the third stage program is executed to the page <84> other than the page <85> closest to the selection gate transistor S2. As a result, the threshold distributions after the third stage program to the page <83> adjacent to the page <84> and the threshold distributions after the first stage program to the page <85> fluctuate in accordance with the inter-cell interference as shown in FIGS. 20C and 10A.

The present embodiment makes it possible to equalize the inter-cell interferences exerted on the pages <0>-<83> and on the page <84> except the inter-cell interference caused by the second, third stage program to the page <k+1>. In a word, it is possible to add the page <85> for 1 bit storage without exerting the influence on the threshold distributions after the program stages to the pages <0>-<84>. As for the page <85>, it is only susceptible to the inter-cell interference caused by the second stage and third stage program to the page <84>, and not susceptible to the inter-cell interference caused by the first stage program to the adjacent page as the page <0> in the comparison example of FIG. 19.

Fourth Embodiment

Next, a data program order in a fourth embodiment of the present invention is described. The present embodiment, similar to the third embodiment, relates to the flash memory with the data assignment in the case 2 of FIGS. 4A-4C, and executes data program to the page <85> in one program stage and executes data program to other pages <k> (k=an integer of 0-84) in three program stages.

FIG. 11 shows the data program order in the present embodiment, and FIGS. 12A and 12B provide diagrams showing the inter-cell interference effect in the data program order of FIG. 11. In FIGS. 12A and 12B the inter-cell interference effects on the pages <0>-<83> are similar to FIG. 20C and omitted therefrom.

As for the 1-252nd programming, they are similar to those in the third embodiment shown in FIG. 9 and accordingly omitted from the following description.

Subsequently, in the 253rd programming, the second stage program is executed to the page <84>. As a result, the threshold distributions after the second stage program to the page <83> adjacent to the page <84> fluctuate in accordance with the inter-cell interference as shown in FIG. 20C.

Subsequently, in the 254th programming, the third stage program is executed to the page <83>. As a result, the threshold distributions after the third stage program to the page <82> adjacent to the page <83> and the threshold distributions after the second stage program to the page <84> fluctuate in accordance with the inter-cell interference as shown in FIG. 20C.

Subsequently, in the 255th programming, the first stage program is executed to the page <85> closest to the selection gate transistor S2. As a result, the threshold distributions after the second stage program to the page <84> adjacent to the page <85> fluctuate in accordance with the inter-cell interference as shown in FIG. 12B.

Finally, in the 256th programming, the third stage program is executed to the page <84> other than the page <85> closest to the selection gate transistor S2. As a result, the threshold distributions after the third stage program to the page <83> adjacent to the page <84> and the threshold distributions after the first stage program to the page <85> fluctuate in accordance with the inter-cell interference as shown in FIGS. 20C and 12A.

Thus, in the case of the present embodiment, the threshold distributions after the first stage program to the page <85> and the threshold distributions after the second stage program to the page <84> are differently susceptible to the inter-cell interference, when compared with the fourth embodiment.

In the case of the fourth embodiment, the threshold distributions after the first stage program to the page <85> are susceptible to the inter-cell interference caused by the second stage and third stage program to the page <84>. In addition, the threshold distributions after the second stage program to the page <84> are susceptible to the inter-cell interference caused by the third stage program to the page <83>.

On the other hand, in the case of the present embodiment, the threshold distributions after the first stage program to the page <85> are susceptible to the inter-cell interference caused by the third stage program to the page 84. In addition, the threshold distributions after the second stage program to the page <84> are susceptible to the inter-cell interference caused by the first stage program to the page <85> and the third stage program to the page <83>. In general, the threshold distributions after the second stage program to the page <k> (k=an integer of 1-83) are susceptible to the inter-cell interference caused by the third stage program to the page <k−1> and the second stage program to the page <k+1>.

Therefore, if the influence of the inter-cell interference caused by the second stage program is not greatly different from the influence of the inter-cell interference caused by the first stage program, the present embodiment makes it possible to reduce the influence of the inter-cell interference exerted on the page <85> from the program to the page <84>.

Fifth Embodiment

Next, a data program order in a fifth embodiment of the present invention is described. The present embodiment relates to the flash memory with the data assignment in the case 3 of FIGS. 4A-4C, and executes data program to the pages <0> and <85> in two program stages and executes data program to other pages <k> (k=an integer of 1-84) in three program stages.

Firstly, prior to description of the data program order, threshold distribution examples in the memory cells MC when 2-bit data program is executed in two program stages are described with reference to FIGS. 13A and 13B.

The memory cells MC have been block-erased previously to bring the thresholds of all memory cells MC in the block to the lowermost "0" level.

Figure 13A:
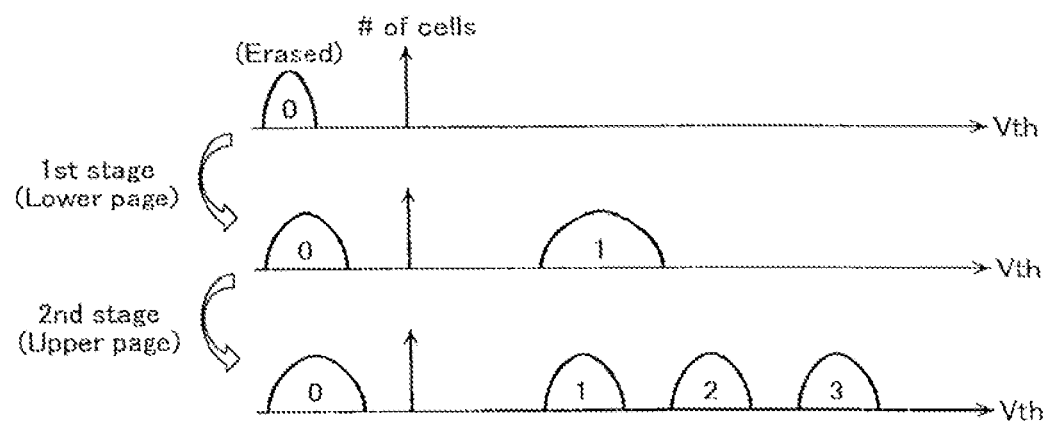
FIGS. 13A and 13B provide diagrams showing data distribution examples in a flash memory according to a fifth embodiment of the present invention.

In the case of FIG. 13A, in the first stage program (1st stage), L page program is executed to pull up the threshold of L page data "0" to "1". In FIGS. 13A and 13B, L page data "0" and "1" corresponds to binary data 1 and 0, respectively.

Thereafter, in the second stage program (2nd stage), U page program is executed in accordance with L page data "0" or "1" to generate threshold distributions of U page data "0" or "1", "2", "3". In FIGS. 13A and 13B, M page data "0", "1", "2" and "3" corresponds to binary data 11, 01, 00 and 10, respectively.

Figure 13B:
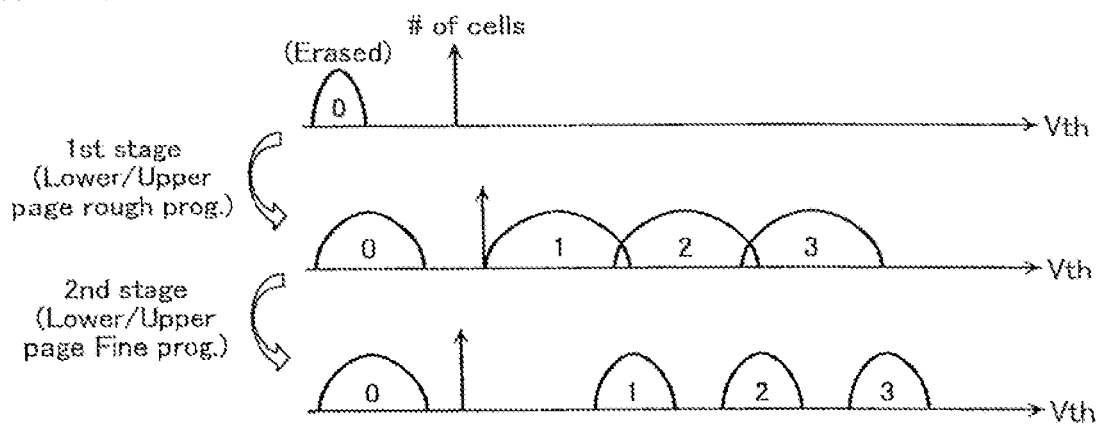

In the case of FIG. 13B, in the first stage program (1st stage), L page and U page rough program is executed, thereby generating threshold distributions of U page data "0"-"3" in accordance with the threshold distribution of L page data "9". At this time, the threshold distributions of U page data "1"-"3" overlap adjacent threshold distributions, respectively.

Then, in the second stage program (2nd stage), L page and U page fine program is executed, thereby narrowing the threshold distributions of U page data "1"-"3" overlapped after the first stage program to separate them definitely.

In either of FIGS. 13A and 13B, the threshold distributions in the memory cell MCk after the program are widened under the inter-cell interference effect caused by programs to be executed later to adjacent memory cells MCk−1 and MCk+1. This effect can be corrected, however, to some extent by the subsequent program to the memory cell MCk. On the other hand, the influence exerted from one inter-cell interference differs in accordance with the number of program stages for adjacent memory cells MCk−1 and MCk+1. For example, in either of FIGS. 13A and 13B, with respect to the second stage program, the applied electrical energy is relatively low. Therefore, the influence of the inter-cell interference caused by the program becomes relatively lower than that at the time of programming in the first stage.

Next, a data program order in a flash memory of an example for comparison with the present embodiment is described. FIG. 21 shows the data program order in the comparison example, and FIGS. 22A and 22B provide diagrams showing the inter-cell interference effect in the data program order of FIG. 21. In FIGS. 22A and 22B the inter-cell interference effects on the pages <2>-<85> are similar to FIG. 20C and omitted therefrom.

Firstly, in the first programming, the first stage program is executed to the page <1> closest to the selection gate transistor S1.

Subsequently, in the second programming, the first stage program is executed to the page <1>. As a result, the threshold distributions after the first stage program to the page <0> adjacent to the page <1> fluctuate in accordance with the inter-cell interference as shown in FIG. 22A.

Subsequently, in the third programming, the second stage program is executed to the page <0>. As a result, the threshold distributions after the first stage program to the page <1> adjacent to the page <0> fluctuate in accordance with the inter-cell interference as shown in FIG. 22B.

Subsequently, in the fourth programming, the first stage program is executed to the page <2>. As a result, the threshold distributions after the first stage program to the page <1> adjacent to the page <2> fluctuate in accordance with the inter-cell interference as shown in FIG. 22B.

Subsequently, in the fifth programming, the second stage program is executed to the page <1>. As a result, the threshold distributions after the second stage program to the page <0> adjacent to the page <1> and the threshold distributions after the first stage program to the page <2> fluctuate in accordance with the inter-cell interference as shown in FIGS. 22A and 20C.

Subsequently, in the 6-254th programming, the first stage program to the page <k>, the second stage program to the page <k−1> and the third stage program to the page <k−2> are executed in order within a range of k=3-85. As a result, the threshold distributions after the i-th (i=1-3) stage program to the certain page <k> fluctuate in accordance with the inter-cell interference caused by the (i+1)-th (except i=3) stage program to the page <k−1> and the i-th stage program to the page <k+1> as shown in FIG. 20C.

Subsequently, in the 255th programming, the second stage program is executed to the page <85> closest to the selection gate transistor S2. As a result, the threshold distributions after the second stage program to the page <84> adjacent to the page <85> fluctuate in accordance with the inter-cell interference as shown in FIG. 20C.

Finally, in the 256th programming, the third stage program is executed to the page <84> other than the page <85> closest to the selection gate transistor S2. As a result, the threshold distributions after the third stage program to the page <83> adjacent to the page <84> and the threshold distributions after the second stage program to the page <85> fluctuate in accordance with the inter-cell interference as shown in FIG. 20C.

Figures 15A, 15B, 16:
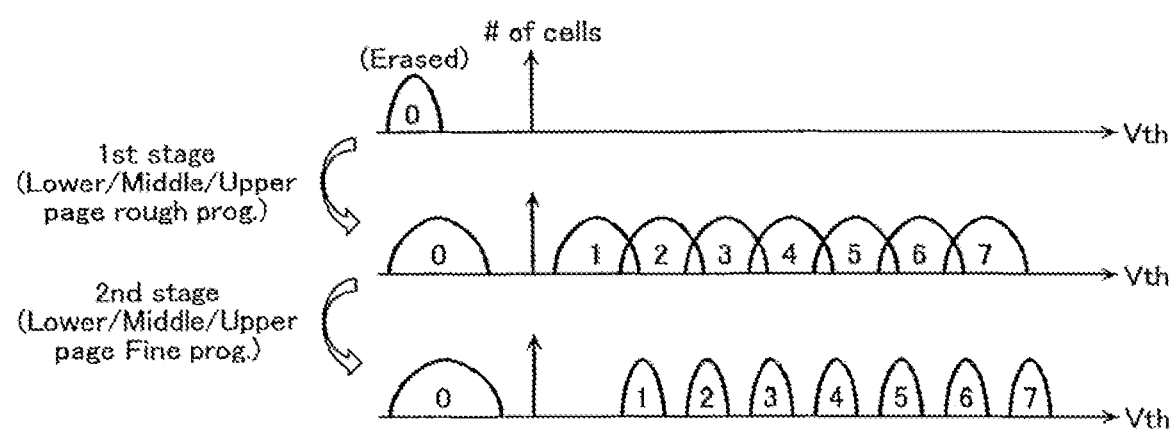
FIGS. 15A and 15B provide diagrams showing the inter-cell interference effect in the data program order of FIG. 14.
FIG. 16 provides diagrams showing data distribution examples in a flash memory according to a sixth embodiment of the present invention.

The following description is given to the data program order in the fifth embodiment of the present invention. FIG. 14 shows the data program order in the present embodiment, and FIGS. 15A and 15B provide diagrams showing the inter-cell interference effect in the data program order of FIG. 14. In FIG. 14 the inter-cell interference effects on the pages <2>-<85> are similar to FIG. 20C and omitted therefrom.

Firstly, in the first programming, the first stage program is executed to the page <1> other than the page <0> closest to the selection gate transistor S1.

Subsequently, in the second programming, the first stage program is executed to the page <0> closest to the selection gate transistor S1. As a result, the threshold distributions after the first stage program to the page <1> adjacent to the page <0> fluctuate in accordance with the inter-cell interference as shown in FIG. 15B.

Subsequently, in the 3-254th programming, the first stage program to the page <k>, the second stage program to the page <k−1> and the third stage program to the page <k−2> are executed in order within a range of k=2-85. As a result, the threshold distributions after the i-th (i=1-3) stage program to the certain page <k> fluctuate in accordance with the inter-cell interference caused by the (i+1)-th (except i=3) stage program to the page <k−1> and the i-th stage program to the page <k+1> as shown in FIG. 20C.

As for the subsequent 255-256th programming, they are similar to those in the comparison example shown in FIG. 21 and accordingly omitted from the following description.

Thus, in the case of the present embodiment, the threshold distributions after the second stage program to the page <0> and the threshold distributions after the second stage program to the page <1> are differently susceptible to the inter-cell interference in particular, when compared with the comparison example.

In the case of the comparison example shown in FIG. 21, the threshold distributions after the second stage program to the page <0> are susceptible to the inter-cell interference caused by the second stage and third stage program to the page <1>. In addition, the threshold distributions after the second stage program to the page <1> are susceptible to the inter-cell interference caused by the second stage program to the page <2>.

On the other hand, in the case of the present embodiment, the threshold distributions after the second stage program to the page <0> are susceptible to the inter-cell interference caused by the third stage program to the page <1>. In addition, the threshold distributions after the second stage program to the page <1> are susceptible to the inter-cell interference caused by the second stage program to the page <0> and the second stage program to the page <2>. In general, the threshold distributions after the second stage program to the page <k> (k=an integer of 2-84) are susceptible to the inter-cell interference caused by the third stage program to the page <k−1> and the second stage program to the page <k+1>.

Therefore, if the influence of the inter-cell interference caused by the second stage program to the page <0> is not greatly different from the influence of the inter-cell interference caused by the third stage program to the pages <1>-<84> that store 3 bits in each memory cell MC, the present embodiment makes it possible to reduce the influence of the inter-cell interference exerted on the page <0> from the program to the page <1> by the inter-cell interference caused by the second stage program to the page <1>, when compared with the comparison example shown in FIG. 21.

Sixth Embodiment

Next, a data program order in a sixth embodiment of the present invention is described. The present embodiment relates to the flash memory with the data assignment in the case 1 of FIGS. 4A-4C, and executes data program to the page <0> in one program stage and executes data program to other pages <k> (k=an integer of 1-84) in two program stages.

Firstly, prior to description of the data program order, threshold distribution examples in the memory cells MC when 3-bit data program is executed in two program stages are described with reference to FIG. 16.

The memory cells MC have been block-erased previously to bring the thresholds of all memory cells MC in the block to the lowermost "0" level.

In the first stage program (1st stage), L page, M page and U page rough program is executed, thereby generating U page data "0"-"7" in accordance with L page data "0". At this time, the threshold distributions of U page data overlap adjacent threshold distributions, respectively.

Then, in the second stage program (2nd stage), L page, M page and U page fine program is executed, thereby narrowing the threshold distributions of U page data "1"-"7" overlapped after the first stage program to separate them definitely.

The following description is given to a data program order for the flash memory configured as above.

First, prior to description of the data program order in the present embodiment, a data program order for a flash memory in a comparison example is described. FIG. 23 shows the data program order in the comparison example, and FIGS. 24A-24C provide diagrams showing the inter-cell interference effect in the data program order of FIG. 23.

Firstly, in the first programming, the first stage program is executed to the page <0> closest to the selection gate transistor S1.

Subsequently, in the second programming, the first stage program is executed to the page <1>. As a result, the threshold distributions after the first stage program to the page <0> adjacent to the page <1> fluctuate in accordance with the inter-cell interference as shown in FIG. 24A.

Subsequently, in the third programming, the first stage program is executed to the page <2>. As a result, the threshold distributions after the first stage program to the page <1> adjacent to the page <2> fluctuate in accordance with the inter-cell interference as shown in FIG. 24B.

Subsequently, in the fourth programming, the second stage program is executed to the page <1>. As a result, the threshold distributions after the first stage program to the page <0> adjacent to the page <1> and the threshold distributions after the first stage program to the page <2> fluctuate in accordance with the inter-cell interference as shown in FIGS. 24A and 24C.

Subsequently, in the 5-170th programming, the first stage program to the page <k> and the second stage program to the page <k−1> are executed in order within a range of k=2-85. As a result, the threshold distributions after the i-th (i=1, 2) stage program to the certain page <k> fluctuate in accordance with the inter-cell interference caused by the (i+1)-th (except i=2) stage program to the page <k−1> and the i-th stage program to the page <k+1> as shown in FIG. 24C.

Finally, in the 171st programming, the second stage program to the page <85> closest to the selection gate transistor. As a result, the threshold distributions after the second stage program to the page <84> adjacent to the page <85> fluctuate in accordance with the inter-cell interference as shown in FIG. 24C.

The following description is given to the data program order in the sixth embodiment of the present invention. FIG. 17 shows the data program order in the present embodiment, and FIGS. 18A and 18B provide diagrams showing the inter-cell interference effect in the data program order of FIG. 17. In FIGS. 18A and 18B the inter-cell interference effects on the pages <0>-<83> are similar to FIG. 24C and omitted therefrom.

Firstly, in the first programming, the first stage program is executed to the page <1> other than the page <0> closest to the selection gate transistor S1.

Subsequently, in the second programming, the first stage program is executed to the page <0> closest to the selection gate transistor S1. As a result, the threshold distributions after the first stage program to the page <1> adjacent to the page <0> fluctuate in accordance with the inter-cell interference as shown in FIG. 18B.

Subsequently, in the third programming, the second stage program is executed to the page <0>. As a result, the threshold distributions after the first stage program to the page <1> adjacent to the page <0> fluctuate in accordance with the inter-cell interference as shown in FIG. 18B.

As for the subsequent 3-171st programming, they are similar to those in the comparison example shown in FIG. 23 and omitted from the following description.

In the present embodiment, the memory cell MC0 in the page <0> closest to the selection gate transistor S1 is designed to have the number of storage bits equal to 1 bit, thereby improving the disturb characteristic at the time of programming.

In the case of the comparison example shown in FIG. 23, the threshold distributions after the first stage program to the page <0> are susceptible to the inter-cell interference caused by the first stage and second stage program to the page <1>. In addition, the threshold distributions after the first stage program to the page <1> are only susceptible to the inter-cell interference caused by the first stage program to the page <2>.

On the other hand, in the case of the present embodiment, the threshold distributions after the first stage program to the page <0> are only susceptible to the inter-cell interference caused by the second stage program to the page <1>. In addition, the threshold distributions after the first stage program to the page <1> are susceptible to the inter-cell interference caused by the first stage program to the page <2> and the first stage program to the page <0>. In general, the threshold distributions after the first stage program to the page <k> (k=an integer of 2-85) are susceptible to the inter-cell interference caused by the second stage program to the page <k−1> and the first stage program to the page <k+1>.

Therefore, if the influence of the inter-cell interference caused by the first stage program to the page <0> is not greatly different from the influence of the inter-cell interference caused by the second stage program to the pages <1>-<85> that store 3 bits in each memory cell MC, the present embodiment makes it possible to reduce the influence of the inter-cell interference exerted on the page <0> from the program to the page <1> by the influence of the inter-cell interference caused by the first stage program to the page <1>, when compared with the comparison example shown in FIG. 23.

Others

The embodiments of the invention have been described above though the present invention is not limited to these but rather can be given various modifications, additions and so forth without departing from the scope and spirit of the invention.

The nonvolatile memories according to the above embodiments all comprise the memory cells having the floating gate as the charge storage layer though they may also comprise memory cells of the charge trap type having an insulator film as the charge storage layer, for example, such as a MONOS structure, to exert the same effect as the above embodiments.

The above embodiments are also applicable to the ABL (All-Bit-Line) access system and the shield bit line access system. For example, if the shield bit line access system is selected, program may be executed to an even bit line and to an odd bit line in order on page access in each data program order.

The ABL access system can program memory cells between adjacent bit lines at the same time, when compared with the shield bit line access system. Accordingly, it can reduce the inter-cell interference between adjacent bit lines.

Data write may be executed by the shield bit line access and data read by the ABL access system to exert the same effect. In this case, to exert the same effect, various combinations of orders may be applied, such as (1) program to an even bit line, program to an odd bit line, verify to ABL; (2) program to an even bit line, verify to ABL, program to an odd bit line; (3) program/verify to an even bit line/an odd bit line; or (4) verify/program to an even bit line/an odd bit line.

What is claimed is:

1. A memory system comprising:
a nonvolatile semiconductor memory device; and
a controller device configured to control the nonvolatile semiconductor memory device,
the nonvolatile semiconductor memory device comprising:
a memory cell array including:
a first selection gate transistor,
a second selection gate transistor, and
a plurality of serially-connected memory cells provided between the first selection gate transistor and the second selection gate transistor,
the memory cells including:
a first memory cell connected with a first word line and capable of being programmed in one stage and storing data of one bit,
a second memory cell connected with a second word line and capable of being programmed in multi stages and storing data of three bits, the second memory cell being closer to the first selection gate transistor as compared with the first memory cell,
a third memory cell connected with a third word line and capable of being programmed in the multi stages and storing data of three bits, the third memory cell being closer to the first selection gate transistor as compared with the second memory cell, and
a fourth memory cell connected with a fourth word line and capable of being programmed in the multi stages and storing data of three bits, the fourth memory cell being closer to the first selection gate transistor as compared with the third memory cell,
the controller device causing the nonvolatile semiconductor memory device to:
perform a first program on the third memory cell as a non-final stage of the multi stages;
perform a second program on the fourth memory cell as a final stage of the multi stages, after the first program is performed;
perform a third program on the second memory cell as the non-final stage of the multi stages, after the second program is performed;
perform a fourth program on the third memory cell as the final stage of the multi stages, after the third program is performed;
perform a fifth program on the first memory cell as the one stage, after the fourth program is performed; and
perform a sixth program on the second memory cell as the final stage of the multi stages, after the fifth program is performed.

2. The system according to claim 1, wherein
the memory cells further include:
a fifth memory cell connected with a fifth word line and capable of being programmed in the multi stages and storing data of three bits, the fifth memory cell being closer to the first selection gate transistor as compared with the fourth memory cell, and
the controller device further causes the nonvolatile semiconductor memory device to:
perform a seventh program on the fifth memory cell as the final stage of the multi stages, before the first program is performed; and
perform an eighth program on the fourth memory cell as the non-final stage of the multi stages, before the seventh program is performed.

3. The system according to claim 2, wherein
the multi stages includes a first stage, a second stage, and a third stage, and
the non-final stage is the second stage, and the final stage is the third stage.

4. The system according to claim 3, wherein:
the controller device further causes the nonvolatile semiconductor memory device to:
perform a ninth program on the third memory cell as the first stage of the multi stages, before the eighth program is performed; and
perform a tenth program on the second memory cell as the first stage of the multi stages, after the seventh program is performed and before the first program is performed.

5. The system according to claim 1, wherein
the memory cell array further includes:
a first dummy cell having a structure same as one of the memory cells between the second selection gate transistor and the first memory cell, and
a second dummy cell having a structure same as one of the memory cells between the first selection gate transistor and the fourth memory cell.

6. The system according to claim 1, wherein
the nonvolatile semiconductor memory device further includes:
a source line connected to a source of the first selection gate transistor, and
a bit line connected to a drain of the second selection gate transistor.

7. A memory system comprising:
a nonvolatile semiconductor memory device; and
a controller device configured to control the nonvolatile semiconductor memory device,
the nonvolatile semiconductor memory device comprising:
a memory cell array including:
a first selection gate transistor,
a second selection gate transistor, and
a plurality of serially-connected memory cells provided between the first selection gate transistor and the second selection gate transistor,
the memory cells including:
a first memory cell connected with a first word line and capable of being storing data of two bits,
a second memory cell connected with a second word line and capable of storing data of three bits, the second memory cell being closer to the first selection gate transistor as compared with the first memory cell,
a third memory cell connected with a third word line and capable of storing data of three bits, the third memory cell being closer to the first selection gate transistor as compared with the second memory cell,
a fourth memory cell connected with a fourth word line and capable of storing data of three bits, the fourth memory cell being closer to the first selection gate transistor as compared with the third memory cell, and a fifth memory cell connected with a fifth word line and capable of storing data of three bits, the fifth memory cell being closer to the first selection gate transistor as compared with the fourth memory cell, the controller device causing the nonvolatile semiconductor memory device to:

perform a first program on the fourth memory cell as a non-final one of stages for writing three bits;

perform a second program on the fifth memory cell as a final one of stages for writing three bits, after the first program is performed;

perform a third program on the third memory cell as the non-final one of stages for writing three bits, after the second program is performed;

perform a fourth program on the fourth memory cell as the final one of stages for writing three bits, after the third program is performed;

perform a fifth program on the second memory cell as the non-final one of stages for writing three bits, after the fourth program is performed;

perform a sixth program on the first memory cell as a final one of stages for writing two bits, after the fifth program is performed; and perform a seventh program on the second memory cell as the final one of stages for writing three bits, after the sixth program is performed.

8. The system according to claim 7, wherein:

the controller device further causes the nonvolatile semiconductor memory device to:

perform an eighth program on the first memory cell as a non-final one of stages for writing two bits, after the fourth program is performed and before the fifth program is performed.

9. The system according to claim 8, wherein the three bits are written in first to third stages, among which the third stage corresponds to the final one of stages, and the second stage corresponds to the non-final one of stages, and the two bits are written in first and second stages, among which the second stage corresponds to the final one of stages, and the first stage corresponds to the non-final one of stages.

10. The system according to claim 9, wherein:

the controller device further causes the nonvolatile semiconductor memory device to:

perform a ninth program on the third memory cell as the first stage for writing three bits, before the first program is performed; and perform a tenth program on the second memory cell as the first stage for writing three bits, after the second program is performed and before the third program is performed.

11. The system according to claim 7, wherein the memory cell array further includes:

a first dummy cell having a structure same as one of the memory cells between the second selection gate transistor and the first memory cell, and a second dummy cell having a structure same as one of the memory cells between the first selection gate transistor and the fifth memory cell.

12. The system according to claim 7, wherein the nonvolatile semiconductor memory device further includes:

a source line connected to a source of the first selection gate transistor, and a bit line connected to a drain of the second selection gate transistor.

13. A memory system comprising:

a nonvolatile semiconductor memory device; and a controller device configured to control the nonvolatile semiconductor memory device, the nonvolatile semiconductor memory device comprising:

a memory cell array including:

a first selection gate transistor, a second selection gate transistor, and a plurality of serially-connected memory cells provided between the first selection gate transistor and the second selection gate transistor, the memory cells including:

a first memory cell connected with a first word line and capable of being programmable in D1 stages to thereby store data of D1 bits, D1 being an integer of 1 or more, a second memory cell connected with a second word line and capable of being programmable in D2 stages to thereby store data of D2 bits, D2 being an integer of 3 or more and greater than D1, the second memory cell being closer to the first selection gate transistor than the first memory cell, a third memory cell connected with a third word line and capable of being programmable in D3 stages to thereby store data of D3 bits, D3 being an integer of 3 or more and greater than D1, the third memory cell being closer to the first selection gate transistor than the second memory cell, and a fourth memory cell connected with a fourth word line and capable of being programmable in D4 stages to thereby store data of D4 bits, D4 being an integer of 3 or more and greater than D1, the fourth memory cell being closer to the first selection gate transistor than the third memory cell, the controller device causing the nonvolatile semiconductor memory device to:

perform a first program on the third memory cell as a first one of the D3 stages;

perform a second program on the fourth memory cell as a second or higher one of the D4 stages, after the first program is performed;

perform a third program on the second memory cell as a first one of the D2 stages, after the second program is performed;

perform a fourth program on the third memory cell as a second or higher one of the D3 stages, after the third program is performed;

perform a fifth program on the first memory cell as a first one of the D1 stages, after the fourth program is performed; and perform a sixth program on the second memory cell as a second or higher one of the D2 stages, after the fifth program is performed.

14. The system according to claim 13, wherein
the sixth program on the second memory cell is performed as the second one of the D2 stages, and
the controller further causes the nonvolatile semiconductor memory device to:
perform a seventh program on the second memory cell as a third or higher one of the D2 stages, after the sixth program is performed.

15. The system according to claim 14, wherein
the second program on the fourth memory cell is performed as the second one of the D4 stages,
the fourth program on the third memory cell is performed as the second one of the D3 stages, and
the controller device further causes the nonvolatile semiconductor memory device to:
  perform an eighth program on the fourth memory cell as a third or higher one of the D4 stages, after the third program is performed and before the fifth program is performed, and
  perform a ninth program on the third memory cell as a third or higher one of the D3 stages, after the fifth program is performed and before the seventh program is performed.

16. The system according to claim 13, wherein
D1 is 1,
D2 is 3,
D3 is 3, and
D4 is 3.

17. The system according to claim 13, wherein
the memory cell array further includes:
  a first dummy cell having a structure same as one of the memory cells between the second selection gate transistor and the first memory cell, and
  a second dummy cell having a structure same as one of the memory cells between the first selection gate transistor and the fourth memory cell.

18. The system according to claim 13, wherein
the nonvolatile semiconductor memory device further includes:
  a source line connected to a source of the first selection gate transistor, and
  a bit line connected to a drain of the second selection gate transistor.

19. A memory system comprising:
a nonvolatile semiconductor memory device; and
a controller device configured to control the nonvolatile semiconductor memory device,
the nonvolatile semiconductor memory device comprising:
a memory cell array including:
  a first selection gate transistor,
  a second selection gate transistor, and
  a plurality of serially-connected memory cells provided between the first selection gate transistor and the second selection gate transistor,
the memory cells including:
  a first memory cell connected with a first word line and capable of being programmable in D1 stages to thereby store data of D1 bits, D1 being an integer of 1 or more,
  a second memory cell connected with a second word line and capable of being programmable in D2 stages to thereby store data of D2 bits, D2 being an integer of 3 or more and greater than D1, the second memory cell being closer to the first selection gate transistor than the first memory cell,
  a third memory cell connected with a third word line and capable of being programmable in D3 stages to thereby store data of D3 bits, D3 being an integer of 3 or more and greater than D1, the third memory cell being closer to the first selection gate transistor than the second memory cell, and
  a fourth memory cell connected with a fourth word line and capable of being programmable in D4 stages to thereby store data of D4 bits, D4 being an integer of 3 or more and greater than D1, the fourth memory cell being closer to the first selection gate transistor than the third memory cell,
the controller device further causing the nonvolatile semiconductor memory device to:
  perform a first program on the third memory cell as a second or lower one of the D3 stages;
  perform a second program on the fourth memory cell as a final one of the D4 stages, after the first program is performed;
  perform a third program on the second memory cell as a second or lower one of the D2 stages, after the second program is performed;
  perform a fourth program on the third memory cell as a final one of the D3 stages, after the third program is performed;
  perform a fifth program on the first memory cell as a first or higher one of the D1 stages, after the fourth program is performed; and
  perform a sixth program on the second memory cell as a final one of the D2 stages, after the fifth program is performed.

20. The system according to claim 19, wherein
the third program on the second memory cell is performed as the second one of the D2 stages, and
the controller device further causes the nonvolatile semiconductor memory device to:
perform a seventh program on the second memory cell as a first one of the D2 stages, before the first program is performed.

21. The system according to claim 20, wherein
the first program on the third memory cell is performed as the second one of the D3 stages, and
the controller device further causes the nonvolatile semiconductor memory device to:
perform an eighth program on the third memory cell as a first one of the D4 stages, before the seventh program is performed.

22. The system according to claim 19, wherein
D1 is 1,
D2 is 3,
D3 is 3, and
D4 is 3.

23. The system according to claim 19, wherein
the memory cell array further includes:
  a first dummy cell having a structure same as one of the memory cells between the second selection gate transistor and the first memory cell, and
  a second dummy cell having a structure same as one of the memory cells between the first selection gate transistor and the fourth memory cell.

24. The system according to claim 19, wherein the nonvolatile semiconductor memory device further includes:
  a source line connected to a source of the first selection gate transistor, and
  a bit line connected to a drain of the second selection gate transistor.

* * * * *